United States Patent
Lai et al.

(10) Patent No.: US 11,342,465 B2
(45) Date of Patent: May 24, 2022

(54) METHOD OF FORMING OXIDE SEMICONDUCTOR FIELD EFFECT TRANSISTOR

(71) Applicant: UNITED MICROELECTRONICS CORP., Hsin-Chu (TW)

(72) Inventors: Chien-Ming Lai, Tainan (TW); Yen-Chen Chen, Tainan (TW); Jen-Po Huang, Tainan (TW); Sheng-Yao Huang, Kaohsiung (TW); Hui-Ling Chen, Kaohsiung (TW); Qinggang Xing, Singapore (SG); Ding-Lung Chen, Singapore (SG); Li Li Ding, Singapore (SG); Yao-Hung Liu, Tainan (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 26 days.

(21) Appl. No.: 17/140,114

(22) Filed: Jan. 3, 2021

(65) Prior Publication Data
US 2021/0126131 A1 Apr. 29, 2021

Related U.S. Application Data

(62) Division of application No. 16/154,644, filed on Oct. 8, 2018, now Pat. No. 11,088,285.

(30) Foreign Application Priority Data

Sep. 7, 2018 (CN) .......................... 201811041792.1

(51) Int. Cl.
| | |
|---|---|
| H01L 29/76 | (2006.01) |
| H01L 29/786 | (2006.01) |
| H01L 29/66 | (2006.01) |
| H01L 29/51 | (2006.01) |
| H01L 29/423 | (2006.01) |
| H01L 29/49 | (2006.01) |
| H01L 29/10 | (2006.01) |

(52) U.S. Cl.
CPC ...... *H01L 29/7869* (2013.01); *H01L 29/1037* (2013.01); *H01L 29/4236* (2013.01); *H01L 29/4966* (2013.01); *H01L 29/51* (2013.01); *H01L 29/66742* (2013.01)

(58) Field of Classification Search
None
See application file for complete search history.

(56) References Cited

U.S. PATENT DOCUMENTS

| | | |
|---|---|---|
| 8,368,068 B2 | 2/2013 | Cho |
| 8,455,869 B2 | 6/2013 | Seo |
| 8,779,432 B2 | 7/2014 | Yamazaki |

(Continued)

*Primary Examiner* — Hung K Vu
(74) *Attorney, Agent, or Firm* — Winston Hsu

(57) ABSTRACT

An oxide semiconductor field effect transistor (OSFET) includes a first insulating layer, a source, a drain, a U-shaped channel layer and a metal gate. The first insulating layer is disposed on a substrate. The source and the drain are disposed in the first insulating layer. The U-shaped channel layer is sandwiched by the source and the drain. The metal gate is disposed on the U-shaped channel layer, wherein the U-shaped channel layer includes at least an oxide semiconductor layer. The present invention also provides a method for forming said oxide semiconductor field effect transistor.

7 Claims, 6 Drawing Sheets

(56) References Cited

U.S. PATENT DOCUMENTS

| | | |
|---|---|---|
| 8,841,665 B2 | 9/2014 | Park |
| 8,901,558 B2 | 12/2014 | Yamazaki |
| 8,946,812 B2 | 2/2015 | Ishizuka |
| 8,981,367 B2 | 3/2015 | Yoneda |
| 8,981,374 B2 | 3/2015 | Kubota |
| 9,007,092 B2 | 4/2015 | Kozuma |
| 9,012,918 B2 | 4/2015 | Yamazaki |
| 9,349,728 B1 | 5/2016 | Hsu |
| 9,847,428 B1 * | 12/2017 | Zhou ................. H01L 29/78648 |
| 2007/0108446 A1 | 5/2007 | Akimoto |
| 2007/0272922 A1 * | 11/2007 | Kim .................... H01L 29/4908 |
| | | 257/43 |
| 2010/0163874 A1 | 7/2010 | Koyama |
| 2018/0019343 A1 | 1/2018 | Asami |
| 2019/0027576 A1 * | 1/2019 | Yang ................. H01L 29/66795 |

\* cited by examiner

3(a)

3(b)

METHOD OF FORMING OXIDE SEMICONDUCTOR FIELD EFFECT TRANSISTOR

CROSS REFERENCE TO RELATED APPLICATIONS

This application is a divisional application of and claims the benefit of U.S. patent application Ser. No. 16/154,644, filed Oct. 8, 2018.

BACKGROUND OF THE INVENTION

1. Field of the Invention

The present invention relates generally to an oxide semiconductor field effect transistor and forming method thereof, and more specifically to an oxide semiconductor field effect transistor having a U-shaped channel layer and forming method thereof.

2. Description of the Prior Art

Amorphous silicon and polysilicon are often used for forming transistors in integrated circuits (ICs) and liquid-crystal display devices, wherein amorphous silicon and polysilicon are located on a substrate having an insulating surface or a glass substrate. Transistors utilizing amorphous silicon are easier to be formed on a large glass substrate, but they also have disadvantages such as low mobility. Although transistors utilizing polysilicon can have high mobility, they cannot be formed in large glass substrates.

Transistors using oxide semiconductor have been attracting attention and are applied in electronic or optical devices. For instance, oxide semiconductor layers containing indium (In), zinc (Zn), gallium (Ga) or tin (Sn) etc are used to manufacture transistors or pixel switchers in display devices.

SUMMARY OF THE INVENTION

The present invention provides an oxide semiconductor field effect transistor and forming method thereof, which only forms a U-shaped channel layer between a source and a drain, thereby simplifying processes, improving the reliability of a back gate and enhancing the sensitivity of tuning the channel layer and the threshold voltage.

The present invention provides an oxide semiconductor field effect transistor including a first insulating layer, a source, a drain, a U-shaped channel layer and a metal gate. The first insulating layer is disposed on a substrate. The source and the drain are disposed in the first insulating layer. The U-shaped channel layer is sandwiched by the source and the drain. The metal gate is disposed on the U-shaped channel layer, wherein the U-shaped channel layer includes at least an oxide semiconductor layer.

The present invention provides a method of forming an oxide semiconductor field effect transistor including the following steps. A back gate is formed in an insulating layer. A back gate insulating layer is formed on the insulating layer. A source/drain layer is formed on the back gate insulating layer. A first insulating layer covers the source/drain layer and the back gate insulating layer. The first insulating layer and the source/drain layer are patterned, thereby forming a source and a drain, and a recess being located in the first insulating layer, wherein the recess separates the source from the drain, but exposes the back gate insulating layer. A U-shaped channel layer and a metal gate are formed in the recess, wherein the U-shaped channel layer includes at least an oxide semiconductor layer.

According to the above, the present invention provides an oxide semiconductor field effect transistor and forming method thereof, which only forms a source and a drain on a back gate insulating layer, a U-shaped channel layer including at least an oxide semiconductor layer sandwiched by the source and the drain, and a metal gate on the U-shaped channel layer. There is no other channel layer in the oxide semiconductor field effect transistor, thereby simplifying structures and restraining the U-shaped channel layer being the only one carrier source, and thus improving the reliability of the back gate, and tuning the channel layer and the threshold voltage sensitively through the back gate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
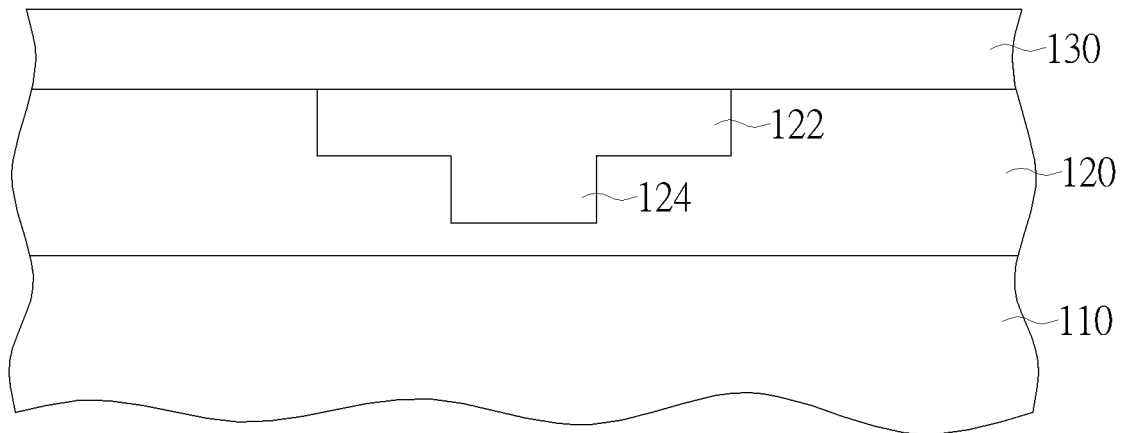
FIG. 1 schematically depicts a cross-sectional view of a method of forming an oxide semiconductor field effect transistor according to an embodiment of the present invention.

FIGS. 1-2, 4-7 schematically depict cross-sectional views of a method of forming an oxide semiconductor field effect transistor according to an embodiment of the present invention. FIG. 3 schematically depicts a cross-sectional view and a top view of a method of forming an oxide semiconductor field effect transistor according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers. An insulating layer 120 is formed on the substrate 110. The insulating layer 120 may be an interlayer dielectric layer, which may be an oxide layer, but it is not limited thereto.

A back gate 122 is formed in the insulating layer 120. The back gate 122 may include a barrier layer (not shown), a seeding layer (not shown) and a conductive material (not shown). Methods of forming the back gate 122 may include the following. A recess (not shown) is formed in the insulating layer 120, a barrier layer (not shown) and a seeding layer (not shown) conformally cover the recess, a conductive material (not shown) fills up the recess, and then the conductive material, the seeding layer and the barrier layer exceeding from the recess are removed (or planarized) until the insulating layer 120 being exposed, thereby the back gate 122 being formed. The barrier layer may include tantalum (Ta), titanium (Ti), tantalum nitride (TaN), titanium nitride (TiN), tungsten nitride (WN) or the combinations of these materials. The material of the seeding layer is preferably common to the material of the conductive material, which may be aluminum (Al), titanium (Ti), tantalum (Ta), tungsten (W), copper (Cu), molybdenum (Mo), niobium (Nb) or etc. Furthermore, the back gate 122 may directly contact a back gate via 124 for connecting to other components, wherein the back gate 122 and the back gate via 124 may be formed by dual damascene processes, but it is not limited thereto. A back gate insulating layer 130 may be formed on the insulating layer 120. The back gate insulating layer 130 may be an oxide layer, but it is not limited thereto.

Figure 2:
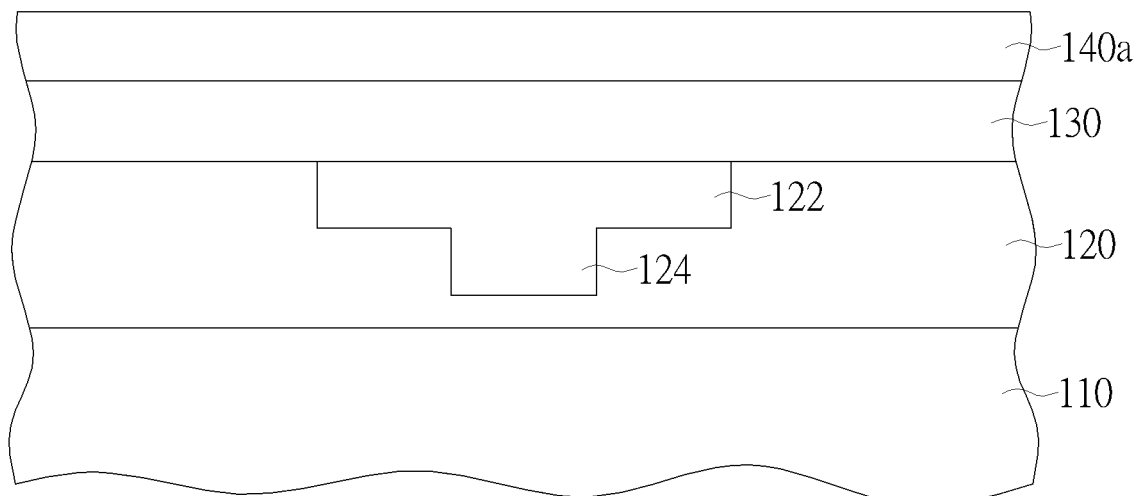
FIG. 2 schematically depicts a cross-sectional view of a method of forming an oxide semiconductor field effect transistor according to an embodiment of the present invention.
Figure 3:
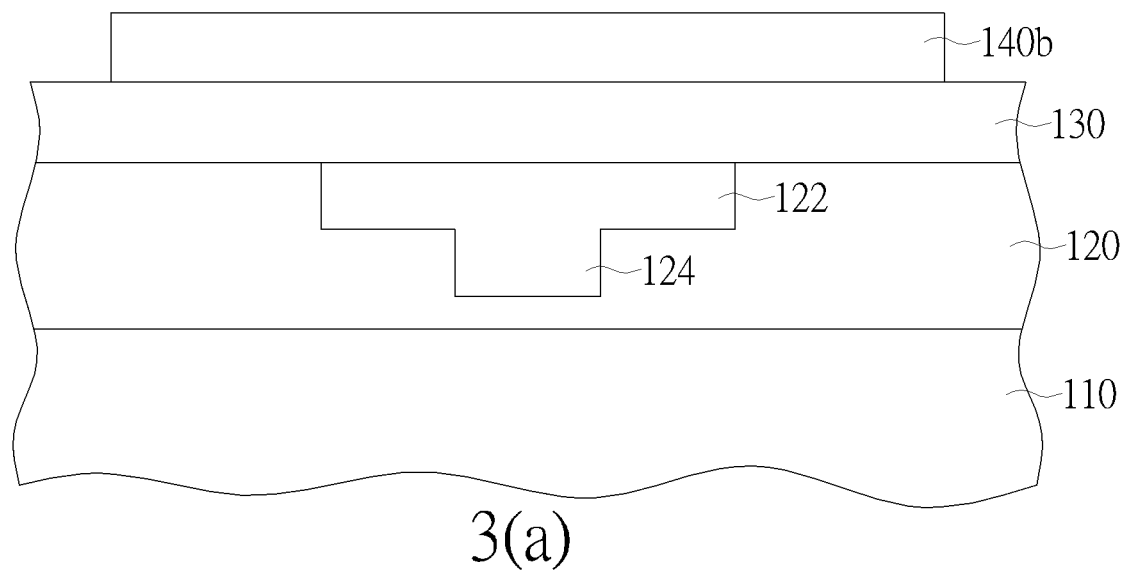
FIG. 3 schematically depicts a cross-sectional view and a top view of a method of forming an oxide semiconductor field effect transistor according to an embodiment of the present invention.
Figure 3:
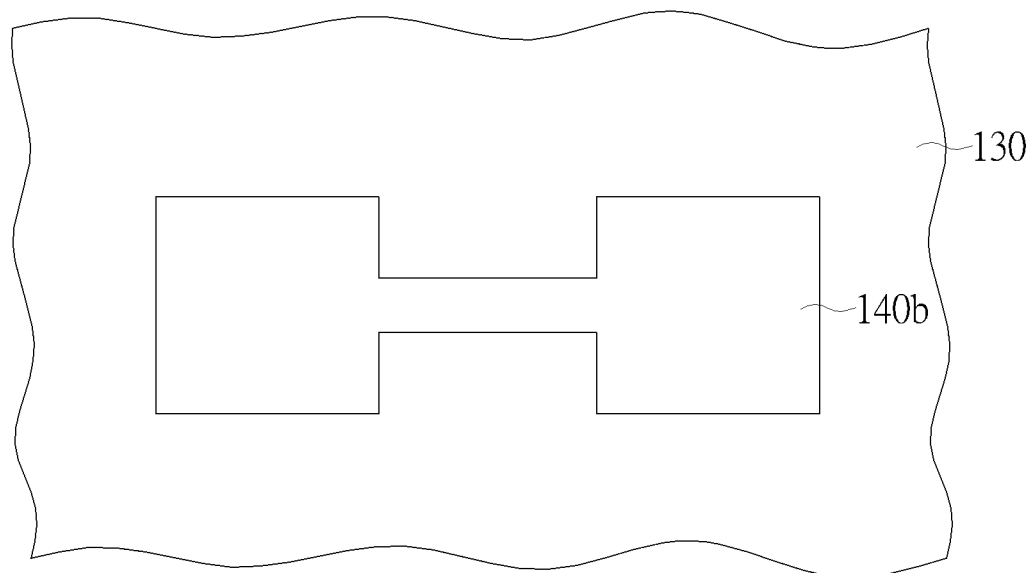

As shown in FIG. 2, a source/drain layer 140a may be formed on the back gate insulating layer 130. The material of the source/drain layer 140a may be metals such as aluminum (Al), chromium (Cr), copper (Cu), tantalum (Ta), titanium (Ti), tungsten (W) or alloys of these metals. As shown in FIG. 3, the source/drain layer 140a is patterned to have a pattern of an oxide semiconductor field effect transistor, thereby a source/drain layer 140b being formed, wherein FIG. 3 (a) schematically depicts a cross-sectional view of a method of forming an oxide semiconductor field effect transistor according to an embodiment of the present invention, and FIG. 3 (b) schematically depicts a top view of a method of forming an oxide semiconductor field effect transistor according to an embodiment of the present invention. For example, a top view of the source/drain layer 140b may have a dumbbell-shape with two ends wider than a middle connecting the two ends as shown in FIG. 3 (b), but it is not limited thereto. As shown in FIG. 3 (a), the source/drain layer 140b is directly formed on the back gate insulating layer 130, and there is no other layer being formed between the source/drain layer 140b and the back gate insulating layer 130, wherein the layer may be channel layers such as oxide semiconductor layers. Therefore, these simplify processes and improve the reliability and the tuning sensitivity of the back gate 122.

Figure 4:
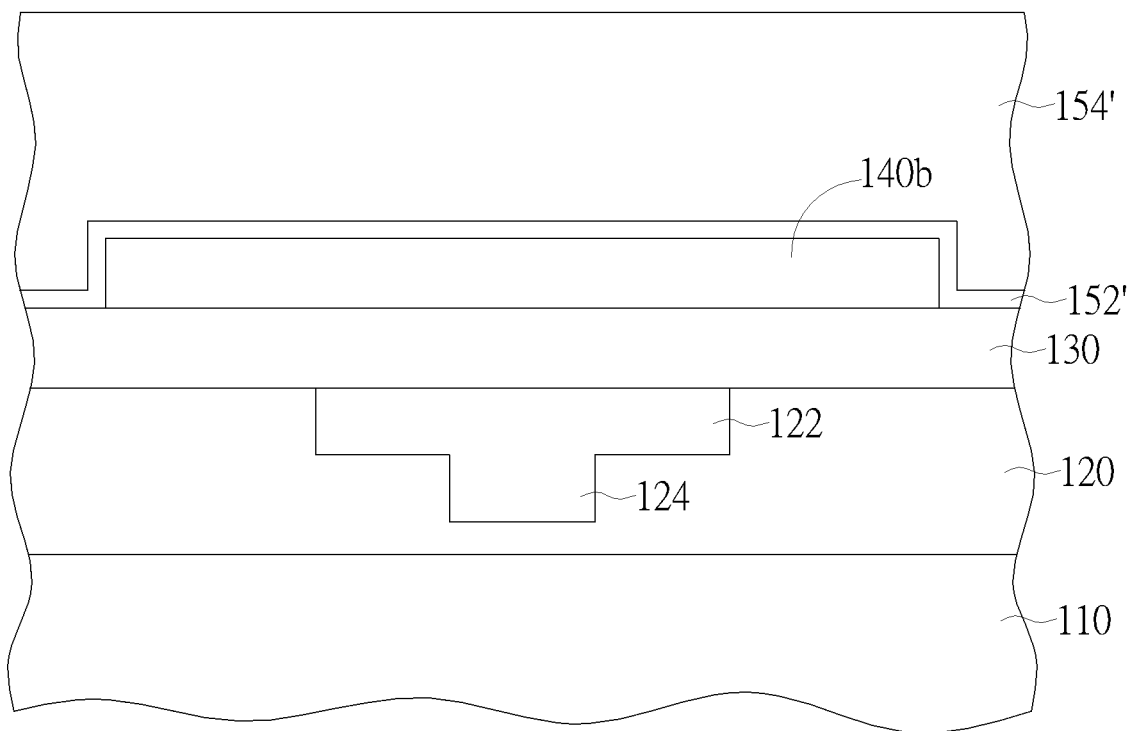
FIG. 4 schematically depicts a cross-sectional view of a method of forming an oxide semiconductor field effect transistor according to an embodiment of the present invention.

As shown in FIG. 4, a cap layer 152' is selectively formed to conformally cover the source/drain layer 140b and the back gate insulating layer 130, and then a first insulating layer 154' covers the source/drain layer 140b and the back gate insulating layer 130 (or covers the cap layer 152'). The cap layer 152' may be a nitride layer, and the first insulating layer 154' may be an oxide layer, but it is not limited thereto.

Figure 5:
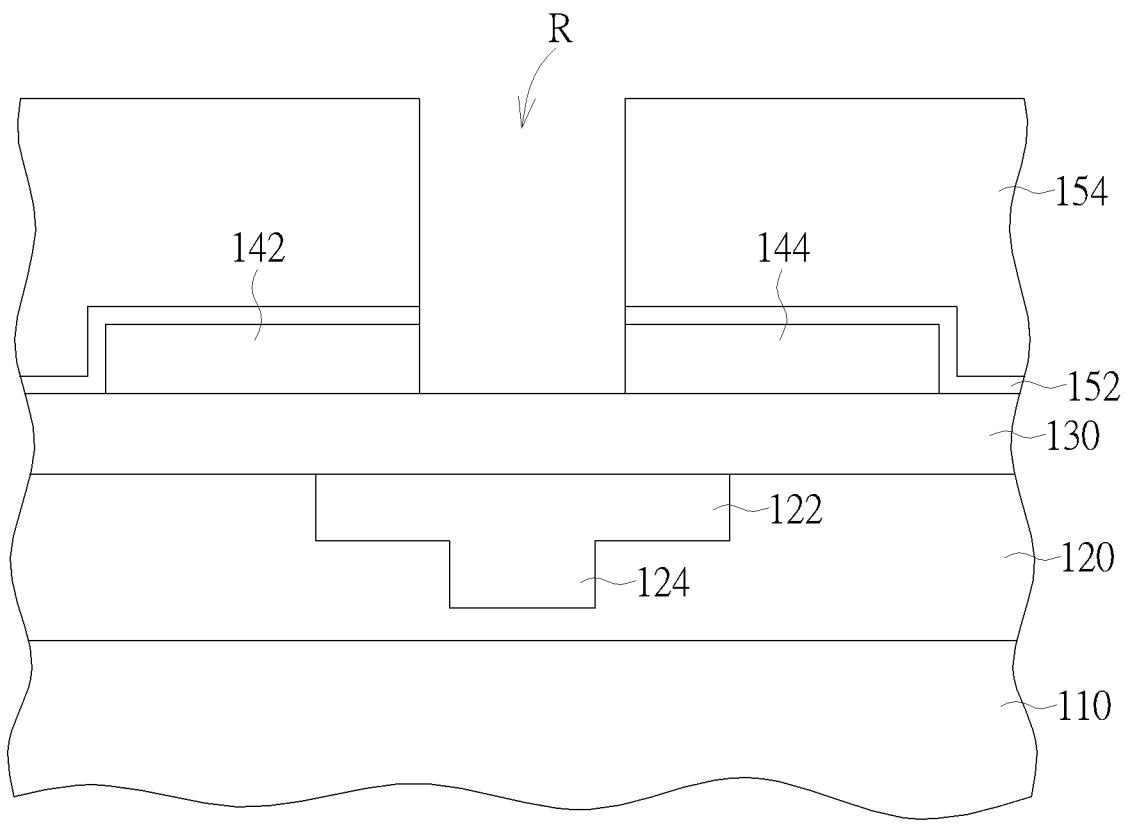
FIG. 5 schematically depicts a cross-sectional view of a method of forming an oxide semiconductor field effect transistor according to an embodiment of the present invention.

Then, the first insulating layer 154' and the source/drain layer 140b are patterned to form a source 142 and a drain 144, and a recess R is in a cap layer 152 and a first insulating layer 154 as shown in FIG. 5, wherein the recess R separates the source 142 from the drain 144 and exposes the back gate insulating layer 130, but it is not limited thereto.

Figure 6:
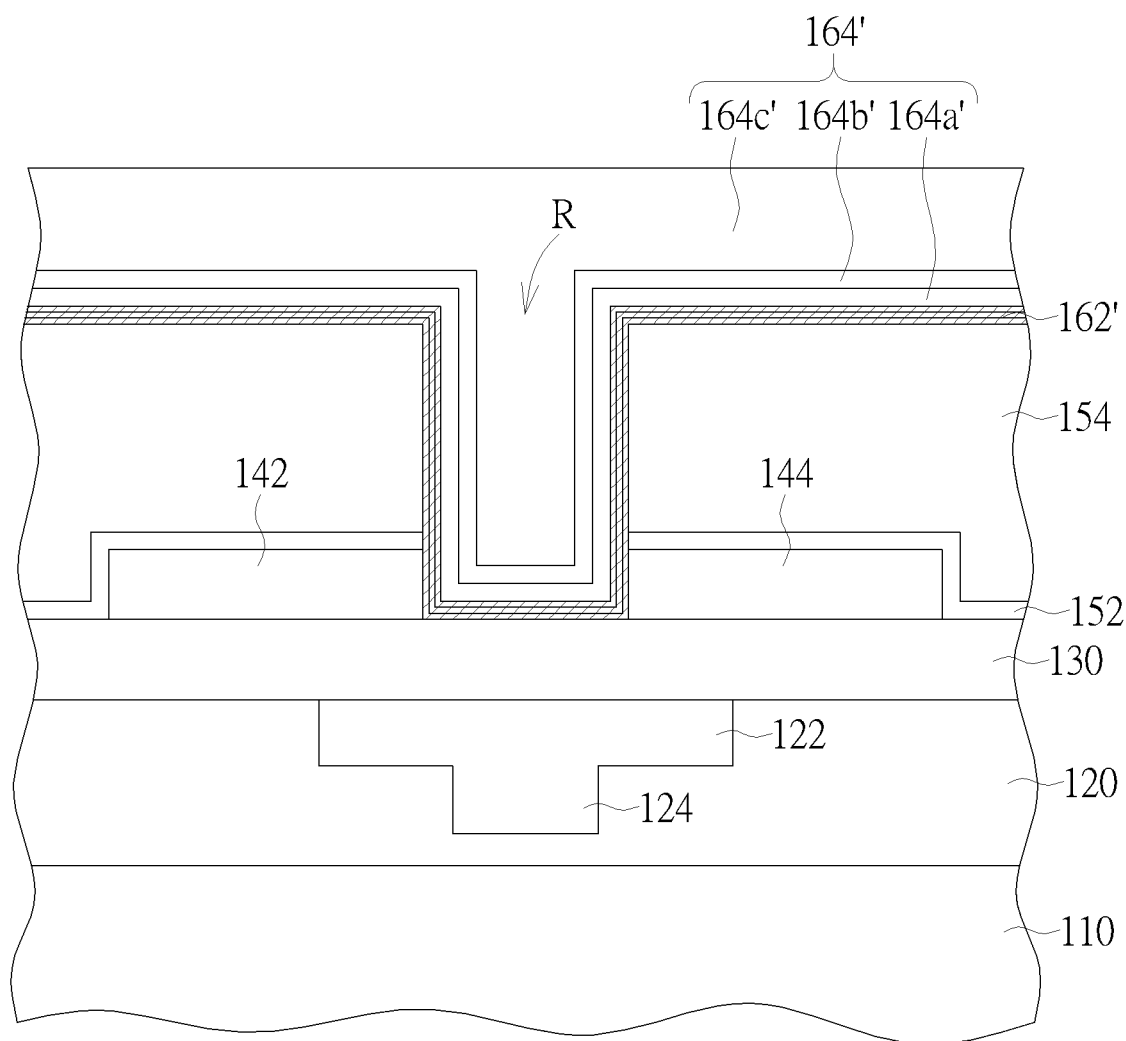
FIG. 6 schematically depicts a cross-sectional view of a method of forming an oxide semiconductor field effect transistor according to an embodiment of the present invention.

As shown in FIG. 6, a channel layer 162' is formed to conformally cover the recess R and the first insulating layer 154, and then a metal gate layer 164' conformally covers the channel layer 162'. The channel layer 162' must include at least an oxide semiconductor layer. In one embodiment, the channel layer 162' may include a plurality of oxide semiconductor layers, and these oxide semiconductor layers may include different materials or may be formed by different processes. In this embodiment, the channel layer 162' includes three layers with different materials of oxide semiconductor layers for being carrier sources, wherein an upper oxide semiconductor layer may be formed by oxidizing a lower oxide semiconductor layer below the upper oxide semiconductor layer, but it is not limited thereto. The materials of the oxide semiconductor layers may include indium gallium zinc oxide (IGZO), indium gallium oxide (IGO), indium aluminum zinc oxide (IAlZO), indium gallium aluminum zinc oxide (IGAlZO), indium zinc oxide (IZO), indium tin zinc oxide (IZTO), indium tin aluminum zinc oxide (IZTAlO), indium hafnium aluminum zinc oxide (IZHfAlO), zinc tin oxide (ZTO) or etc. The metal gate layer 164' may include a gate oxide layer 164a', a metal layer 164b' and a low resistivity metal 164c', wherein the gate oxide layer 164a' may include silicon oxide; the metal layer 164b' may be a single layer or a composite layer, which may include titanium nitride (TiN), titanium carbide (TiC), tantalum nitride (TaN), tantalum carbide (TaC), tungsten carbide (WC), titanium aluminide (TiAl) or aluminum titanium nitride (TiAlN); the low resistivity metal 164c' may include metals such as aluminum (Al), titanium (Ti), tantalum (Ta), tungsten (W), copper (Cu), molybdenum (Mo), niobium (Nb), but it is not limited thereto. In this case, the gate oxide layer 164a' is an oxide layer while the metal layer 164b' is a nitride layer.

Figure 7:
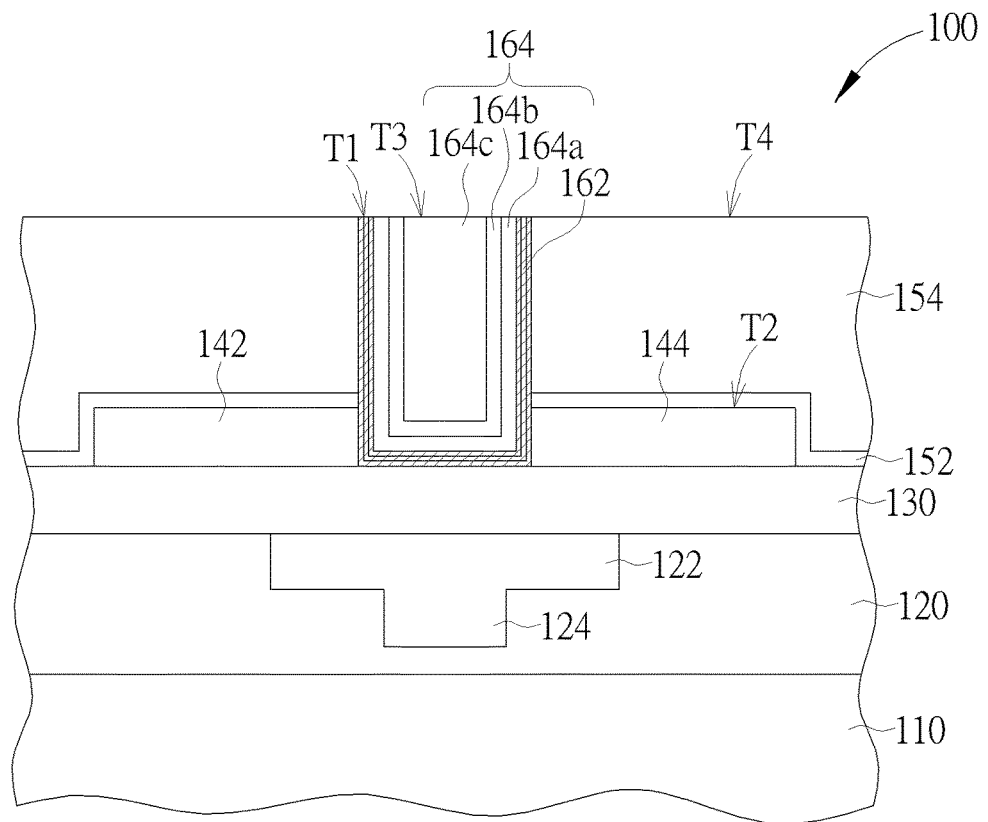
FIG. 7 schematically depicts a cross-sectional view of a method of forming an oxide semiconductor field effect transistor according to an embodiment of the present invention.

Thereafter, the metal gate layer 164' and the channel layer 162' exceeding from the recess R are removed to form a U-shaped channel layer 162 and a metal gate 164, and the metal gate 164 may include a gate oxide layer 164a, a metal layer 164b and a low resistivity metal 164c, as shown in FIG. 7. Since the source/drain layer 140b, the cap layer 152' and the first insulating layer 154' are formed and then patterned to form the source 142 and the drain 144, and the recess R in the cap layer 152 and the first insulating layer 154, and then the U-shaped channel layer 162 and the metal gate 164 fill the recess R, the gate oxide layer 164a and the metal layer 164b of the present invention therefore have U-shaped cross-sectional profiles, and the U-shaped channel layer 162 and the metal gate 164 are sandwiched by the source 142 and the drain 144.

A top surface T1 of the U-shaped channel layer 162 is higher than top surfaces T2 of the source 142 and the drain 144. A top surface T3 of the metal gate 164 is higher than the top surfaces T2 of the source 142 and the drain 144. The top surface T1 of the U-shaped channel layer 162 and a top surface T4 of the first insulating layer 154 are coplanar. In a preferred embodiment, the back gate 122 of an oxide semiconductor field effect transistor 100 is disposed right below the U-shaped channel layer 162, and the whole U-shaped channel layer 162 vertically overlaps the back gate 122. In a still preferred embodiment, the back gate 122 protrudes from the U-shaped channel layer 162, so that the reliability of the back gate 122 can be enhanced and the tuning sensitivity of the U-shaped channel layer 162 can be improved.

Figure 8:
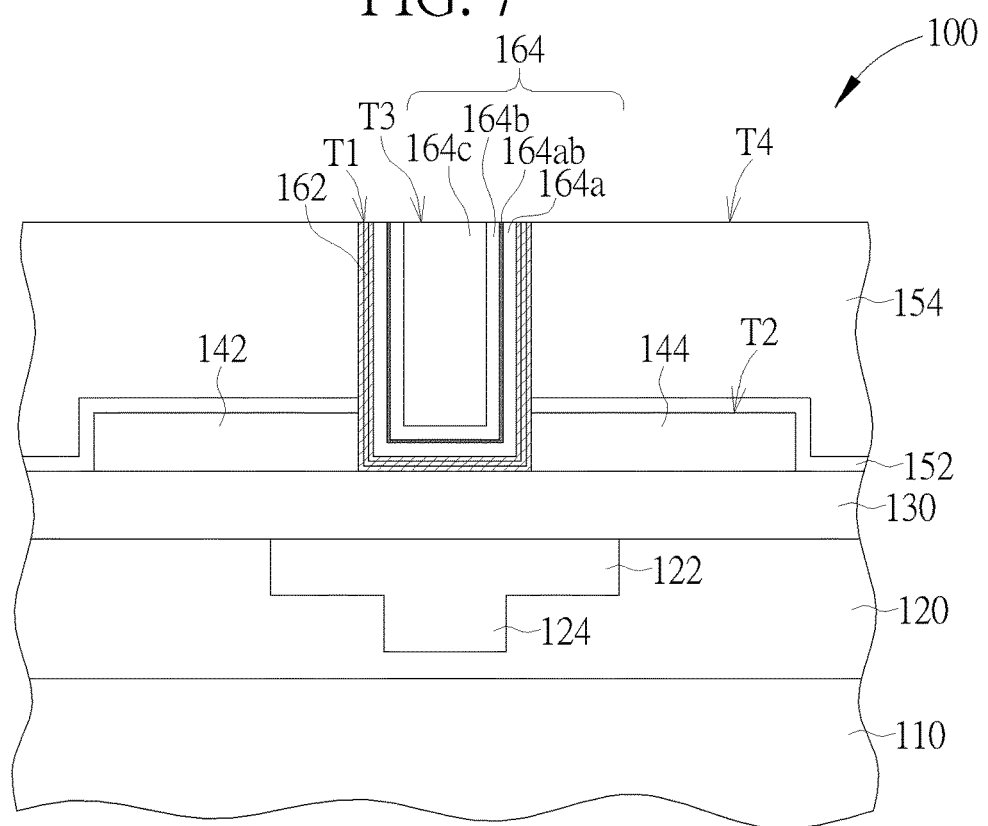
FIG. 8 schematically depicts a cross-sectional view of a method of forming an oxide semiconductor field effect transistor according to another embodiment of the present invention.

Since the source 142 and the drain 144 are directly on the back gate insulating layer 130, the U-shaped channel layer 162 is sandwiched by the source 142 and the drain 144, and there is no channel layer such as an oxide semiconductor layer between the source 142/drain 144 and the back gate insulating layer 130, the structure of the oxide semiconductor field effect transistor 100 is simplified, the reliability of the back gate is improved and the controlling to the U-shaped channel layer 162 is enhanced due to carriers being retrained in the U-shaped channel layer 162, therefore tuning the back gate can being more sensitively. Furthermore, as the gate oxide layer 164a' of FIG. 6 is an oxide layer and the metal layer 164b' is a titanium nitride layer, a composite layer 164ab may be formed between the gate oxide layer 164a and the metal layer 164b, and thus reducing the threshold voltage, as shown in FIG. 8.

Figure 9:
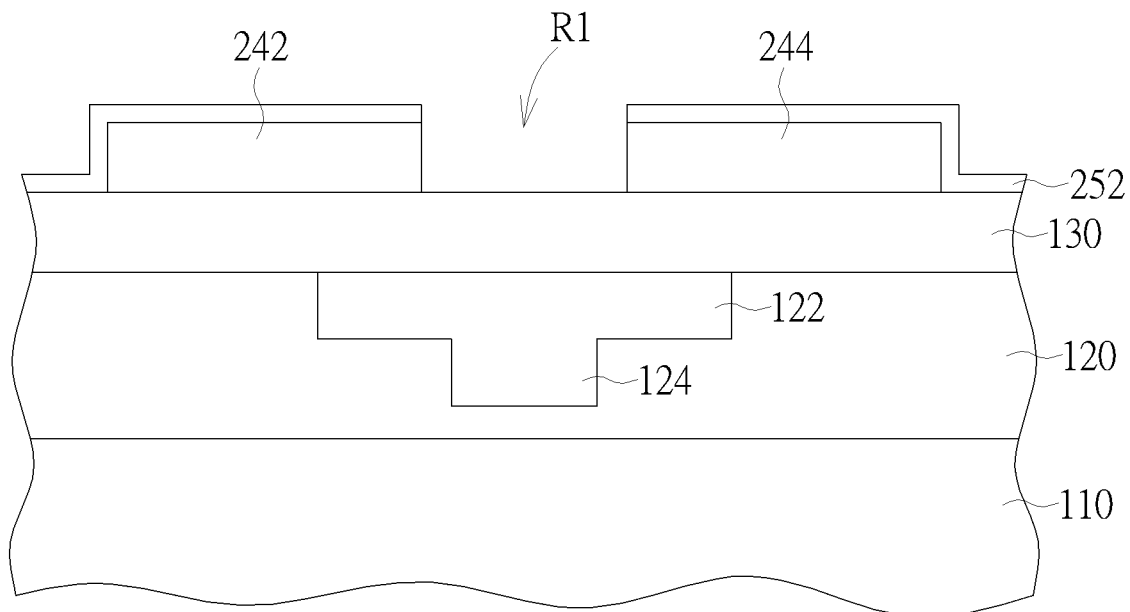
FIG. 9 schematically depicts a cross-sectional view of a method of forming an oxide semiconductor field effect transistor according to another embodiment of the present invention.
Figure 10:
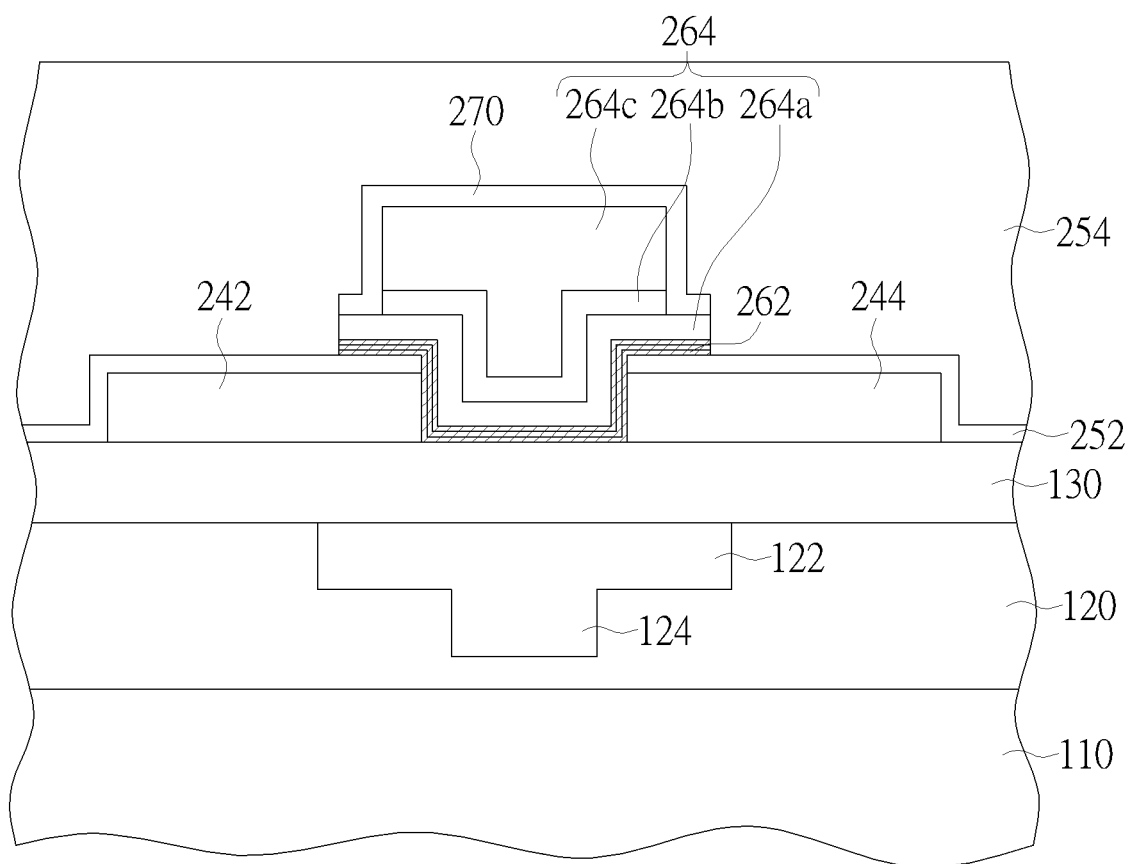
FIG. 10 schematically depicts a cross-sectional view of a method of forming an oxide semiconductor field effect transistor according to another embodiment of the present invention.

Another embodiment is presented as follows, which forms a channel layer and then a first insulating layer covers the channel layer blanketly. FIGS. 9-10 schematically depicts cross-sectional views of a method of forming an oxide semiconductor field effect transistor according to another embodiment of the present invention. As shown in FIG. 9, after the source/drain layer 140a is patterned to have a pattern of an oxide semiconductor field effect transistor and thus the source/drain layer 140b is formed as shown in FIG. 3, a cap layer (not shown) is selectively formed to conformally cover the source/drain layer 140b and the back gate insulating layer 130 instead, and then the cap layer and the source/drain layer 140b are patterned to form a cap layer 252 covering a source 242 and a drain 244, and a recess R1 separating the source 242 form the drain 244 to expose the back gate insulating layer 130. The cap layer 252 may be a nitride layer, but it is not limited thereto.

As shown in FIG. 10, a channel layer (not shown), a gate oxide layer (not shown), a metal layer (not shown) and a low resistivity metal (not shown) are sequentially formed to conformally cover the back gate insulating layer 130, the source 242, the drain 244 and the recess R1; the low resistivity metal (not shown) and the metal layer (not shown) are patterned; a gate cap layer (not shown) conformally covers the low resistivity metal (not shown), the metal layer (not shown), the gate oxide layer (not shown), channel layer (not shown), the source 242, the drain 244 and the back gate insulating layer 130; and then, the gate cap layer (not shown), gate oxide layer (not shown) and the channel layer (not shown) are patterned to form a channel layer 262, a metal gate 264 and a gate cap layer 270. The channel layer 262 of the present invention must contain at least an oxide semiconductor layer. In one case, the channel layer 262 may include a plurality of oxide semiconductor layers, wherein the oxide semiconductor layers may have different materials and may be formed by different processes. In this case, the channel layer 262 are three layers with oxide semiconductor layers of different materials to be carrier sources, wherein an upper oxide semiconductor layer may be formed by oxidizing an lower oxide semiconductor layer, but it is not limited thereto. The materials of the oxide semiconductor layers may include indium gallium zinc oxide (IGZO), indium gallium oxide (IGO), indium aluminum zinc oxide (IAlZO), indium gallium aluminum zinc oxide (IGAlZO), indium zinc oxide (IZO), indium tin zinc oxide (IZTO), indium tin aluminum zinc oxide (IZTAlO), indium hafnium aluminum zinc oxide (IZHfAlO), zinc tin oxide (ZTO) or etc. The metal gate 264 may include a gate oxide layer 264a, a metal layer 264b and a low resistivity metal 264c, wherein the gate oxide layer 264a may include silicon oxide; the metal layer 264b may be a single layer or a composite layer, which may include titanium nitride (TiN), titanium carbide (TiC), tantalum nitride (TaN), tantalum carbide (TaC), tungsten carbide (WC), titanium aluminide (TiAl) or aluminum titanium nitride (TiAlN); the low resistivity metal 264c may include aluminum (Al), titanium (Ti), tantalum (Ta), tungsten (W), copper (Cu), molybdenum (Mo), niobium (Nb); the gate cap layer 270 may be a nitride layer, but it is not limited thereto. Thereafter, a first insulating layer 254 is formed blanketly. The first insulating layer 254 may be an oxide layer, but it is not limited thereto. The channel layer 262 and the metal gate 264 have different cross-sectional views from the previously embodiment, depending upon practical requirements.

To summarize, the present invention provides an oxide semiconductor field effect transistor and forming method thereof, which only forms a source and a drain on a back gate insulating layer, a U-shaped channel layer including at least an oxide semiconductor layer sandwiched by the source and the drain, and a metal gate on the U-shaped channel layer. There is no other channel layer in the oxide semiconductor field effect transistor, thereby simplifying processes and restraining the U-shaped channel layer being the only one carrier source, and thus improving the controlling of the back gate to the U-shaped channel layer. More precisely, there is no channel layer such as an oxide semiconductor layer being formed between the source/drain and the back gate insulating layer, and thus improving the reliability and the controlling of the back gate, and tuning the threshold voltage sensitively through the back gate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming an oxide semiconductor field effect transistor, comprising:
    forming a back gate insulating layer on an insulating layer;
    forming a source/drain layer on the back gate insulating layer;
    forming a first insulating layer covering the source/drain layer and the back gate insulating layer;
    patterning the first insulating layer and the source/drain layer, thereby forming a source and a drain, and a recess being located in the first insulating layer, wherein the recess separates the source from the drain, but exposes the back gate insulating layer; and
    forming a U-shaped channel layer and a metal gate in the recess, wherein the U-shaped channel layer comprises at least an oxide semiconductor layer.

2. The method of forming an oxide semiconductor field effect transistor according to claim 1, wherein the metal gate comprises a gate oxide layer, a metal layer and a low resistivity metal.

3. The method of forming an oxide semiconductor field effect transistor according to claim 2, further comprising:
    a composite layer located between the gate oxide layer and the metal layer.

4. The method of forming an oxide semiconductor field effect transistor according to claim 2, wherein the gate oxide layer and the metal layer have U-shaped cross-sectional profiles.

5. The method of forming an oxide semiconductor field effect transistor according to claim 1, wherein a top surface of the U-shaped channel layer is higher than top surfaces of the source and the drain.

6. The method of forming an oxide semiconductor field effect transistor according to claim 1, wherein a top surface of the U-shaped channel layer and a top surface of the first insulating layer are coplanar.

7. The method of forming an oxide semiconductor field effect transistor according to claim 1, wherein the steps of forming the U-shaped channel layer and the metal gate in the recess comprise:

sequentially forming a channel layer conformally covering the recess and the first insulating layer, and a metal gate layer on the channel layer; and removing the metal gate layer and the channel layer exceeding from the recess.

* * * * *